US005164358A

United States Patent [19]

Buck et al.

[11] Patent Number: 5,164,358

[45] Date of Patent: Nov. 17, 1992

[54] SUPERCONDUCTING FILTER WITH REDUCED ELECTROMAGNETIC LEAKAGE

[75] Inventors: Daniel C. Buck, Hanover, Md.; Bruce R. McAvoy, Pittsburgh, Pa.

[73] Assignee: Westinghouse Electric Corp., Pittsburgh, Pa.

[21] Appl. No.: 600,893

[22] Filed: Oct. 22, 1990

[51] Int. Cl.$^5$ ....................... H01P 1/203; H01L 39/02

[52] U.S. Cl. ....................................... 505/1; 505/700; 505/701; 333/204; 333/99 S

[58] Field of Search ............... 333/202, 204, 205, 246, 333/99 S; 505/1, 700, 701

[56] References Cited

U.S. PATENT DOCUMENTS

| | | | |
|---|---|---|---|
| 2,751,558 | 6/1956 | Grieg et al. | 333/204 |
| 2,760,169 | 8/1956 | Engelmann | 333/204 |
| 3,104,362 | 9/1963 | Matthaei | 333/204 |
| 3,391,356 | 7/1968 | Bolljahn et al. | 333/203 |
| 3,451,015 | 6/1969 | Heath | 333/203 |
| 3,740,675 | 6/1973 | Moore et al. | 333/204 |
| 3,754,198 | 8/1973 | Anghel | 333/204 |
| 3,857,114 | 12/1974 | Minet et al. | 333/204 X |
| 3,986,147 | 10/1976 | Carter et al. | 333/204 |
| 4,020,428 | 4/1977 | Friend et al. | 333/203 |
| 4,053,855 | 10/1977 | Kivi et al. | 333/203 |
| 4,266,206 | 5/1981 | Bedard et al. | 333/204 |
| 4,270,106 | 5/1981 | Woermbke | 333/246 |

FOREIGN PATENT DOCUMENTS

| | | | |
|---|---|---|---|
| 63201 | 4/1983 | Japan | 333/204 |
| 59103 | 3/1988 | Japan | 333/204 |
| 189206 | 7/1989 | Japan | 333/219.1 |

OTHER PUBLICATIONS

Bybokas, J., et al; "High Temperature Superconductors"; *Microwave Journal*; Feb. 1990; pp. 127–138.

McAvoy, B. R., et al; "Superconductive Stripline resonator performance"; *Proc 1988 Applied Superconductivity Conf*; Aug. 22, 1988.

Cohn, Seymour; "Parallel-Coupled Transmission line Resonator Filters"; *IRE Trans on Microwave Theory & Techniques*; Apr. 1958; pp. 223–231.

McGraw-Hill Dictionary Of Scientific and Technical Terms, Third Edition, 1974, pp. 81 and 853.

*Primary Examiner*—Eugene R. LaRoche
*Assistant Examiner*—Benny T. Lee
*Attorney, Agent, or Firm*—Thomas H. Martin

[57] ABSTRACT

A stripline filter with suppressed electro-magnetic leakage. A filter topology suppresses generation of spurious waveguide modes by structuring microstrip launchers to operate as a waveguide way beyond cutoff of the waveguide modes, and by damping out remaining waveguide mode energy with lossy stripes in the filter package.

10 Claims, 2 Drawing Sheets

SUPERCONDUCTING FILTER WITH REDUCED ELECTROMAGNETIC LEAKAGE

BACKGROUND OF THE INVENTION

The present invention relates to microwave filters and more particularly to a superconducting stripline filter structure for reducing electromagnetic leakage.

There are many applications for high Q, low loss filters including, for example, radar systems. Some radar systems employ filter banks operating in frequencies ranging from the S band to the Ku band. These filters typically have passband widths in the range of 50–100 MHz. In radar systems, the filters are required to have low insertion loss, high dynamic range, and a small size. To achieve the narrow passband widths, the filters need unloaded Qs in the range of $10^4$. Typically, with current superconductor technology stripline microwave filters can have high Qs and small sizes. However, mechanical connections to stripline filters normally require the use of microstrip structures. Such microstrip structures cause the generation of spurious waveguide modes within the filter due to its asymmetrical structure.

SUMMARY OF THE INVENTION

It is an object of the present invention to provide a stripline filter having reduced electromagnetic leakage.

It is another object of the present invention to provide a superconductive stripline filter having a high Q, low insertion loss and small size.

It is a further object of the present invention to provide a superconducting stripline filter having reduced electromagnetic leakage.

To achieve the above and other objects, the present invention provides a superconducting stripline filter for filtering a received signal that comprises a first dielectric substrate having an isotropic or nearly isotropic dielectric constant along a direction of propagation of the signal, the first dielectric substrate includes a body and first and second microstrip launchers at respective ends of the body, each microstrip launcher having a width that is less than one half of a wavelength of a waveguide mode of the signal and has a length selected to attenuate the waveguide mode by a predetermined amount of loss; a second dielectric substrate having a first face positioned to oppose the first dielectric substrate and a shape corresponding to that of the body, the second dielectric substrate having a ground plane disposed on the first face and absorbing stripes disposed along the ground plane; and resonator stripes disposed on the first dielectric substrate.

DESCRIPTION OF THE PREFERRED EMBODIMENT

Figure 1A:
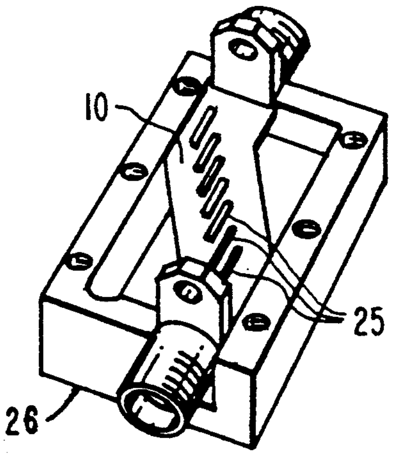
FIGS. 1A and 1B illustrate a stripline filter embodying the present invention.
Figure 1B:
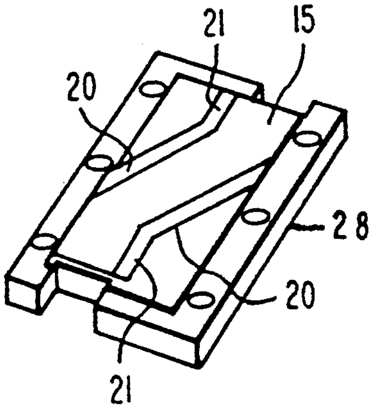

FIGS. 1A and 1B illustrate a stripline filter embodying the present invention. In FIG. 1A, reference numeral 10 identifies a central body of a first dielectric substrate. The first dielectric substrate 10 has resonator stripes 25 formed on an inner face. FIG. 1B shows a second dielectric substrate 15 that has a shape corresponding to that of the first dielectric substrate 10. The second dielectric substrate has a ground plane formed on an inner face (opposing the inner face of the first dielectric substrate when assembled) and absorbing stripes 20 along the ground plane. The absorbing stripes can comprise any commercially available absorbing material such as EMI shielding, Gore-Tex manufactured by W. L. Gore & Associates, Inc., 1901 Barksdale Road, Newark, Del. 19714-9236. Each of the absorbing stripes 20 includes a strip portion 21. The strip portion 21 intersects wall currents associated with the $TE_{10}$ waveguide mode. In a preferred embodiment of the present invention, a stripline filter is housed in a package comprising a bottom portion 26 and a top portion 28. The package comprises a conducting material. As a result, the package imposes the known waveguide boundary conditions on the filter environment.

In a preferred embodiment of the present invention, the first and second dielectric substrates (10, 15) comprise sapphire. The first dielectric substrate 10 comprises sapphire having a cut such that the C-axis 29 (FIG. 2) is in the direction of the resonator stripes. The resonator stripes can comprise a superconductor, for example, Nb. When the second dielectric substrate is positioned on the first dielectric substrate, the combination forms a stripline filter body.

Figure 2:
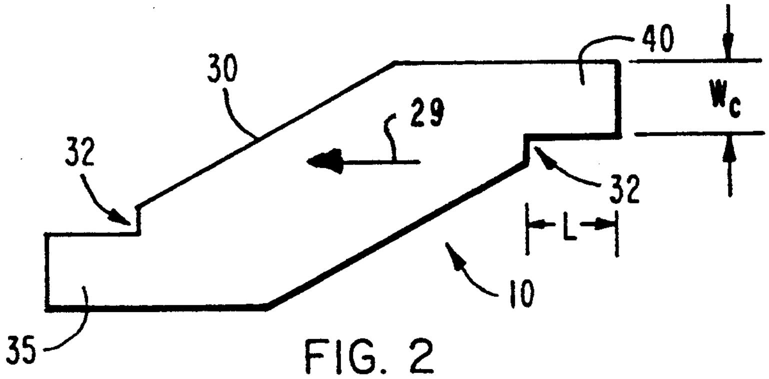
FIG. 2 is a plan view of a dielectric substrate in accordance with the present invention.

FIG. 2 is a plan view of a dielectric substrate in accordance with the present invention. In FIG. 2, reference numeral 30 identifies a filter body portion of the first dielectric substrate 10. The shape of the second dielectric substrate 15 is the same as the filter body portion 30 of the first dielectric substrate. Extending from the filter body section 30 are first and second microstrip launching regions 35 and 40. The widths of the filter body section 30, shown in FIG. 3 cannot always be made narrow enough to cause the cutoff frequency of the filter body to be higher than the operating frequency. This necessitates the use of the first and second microstrip launching regions (35, 40). Because each of the microstrip launching regions (35, 40) has a narrow width $W_c$ (as discussed below), the first substrate 10 includes jogs 32 as shown in FIG. 2.

Figure 3:
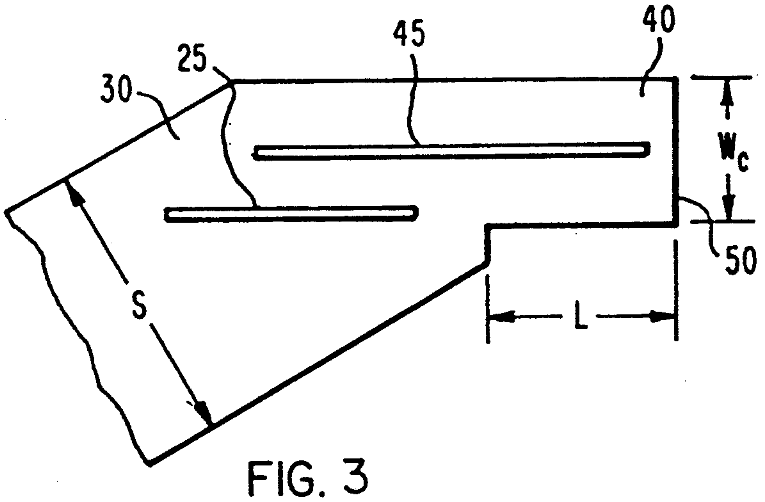
FIG. 3 is a plan view of a section of the FIG. 2 dielectric substrate.

FIG. 3 is a detailed plan view of a section of the first dielectric substrate 10 shown in FIG. 2. In FIG. 3, the second microstrip launching region 40 has a structure that is identical to the first microstrip launching region 35 (not shown in FIG. 3) with a length L and a width $W_c$. A microstrip 45 is positioned on the first dielectric substrate 10 between an edge 50 and a region adjacent to a resonator stripe 25. Because of the asymmetrical structure of the microstrip launching region 34, 40, the electric field in this region is distorted. This gives rise to unwanted leakage modes, for example, waveguide modes such as the $TE_{10}$ mode. The width $W_c$ of each microstrip launching region 35, 40 is selected so that the $TE_{10}$ mode cutoff frequency is considerably higher than that of the stripline filter section 30. The length L of each microstrip launching region 35, 40 is selected to be long enough to damp out any waveguide modes that are created in the microstrip launchers (35, 40).

For example, if the wavelength in the microstrip $\lambda_m$ is approximately 0.4 the wavelength in air $\lambda_{air}$, then the wavelength $\lambda_m$ at 9 GHz is approximately 1.08 cm. The cutoff wavelength for a $TE_{10}$ waveguide mode is approximately $2W_c$. In other words, the cutoff frequency $f_{cutoff}$ is approximately $30/2W_c$ or $15/W_c$ GHz, where $W_c$ is the width of the microstrip launching region shown in FIG. 3 expressed in centimeters.

The attenuation coefficient a for the $TE_{10}$ waveguide mode in the microstrip launching regions 35, 40 is expressed as follows:

$$\alpha = 8.68 \frac{2\pi f_1}{c} \times \sqrt{\left(\frac{f_c}{f_1}\right)^2 - 1}\ dB/\text{cm}$$

where $f_1$ is the operating frequency of the filter, $f_c$ is the cutoff frequency of the microstrip launching region 35, 40, and c is the velocity of light in free space. For high ratios of cutoff frequencies to operating frequency, the attenuation coefficient in dB/cm for the $TE_{10}$ waveguide mode is approximately $54.5/\lambda_c$. The total attenuation per length of a microstrip launching region 35, 40 is $54.5L/\lambda_c$. Since $\lambda_c$ is approximately $2W_c$, the total attenuation for a microstrip launching region 35, 40 is $27.25L/W_c$ dB.

Figure 4:
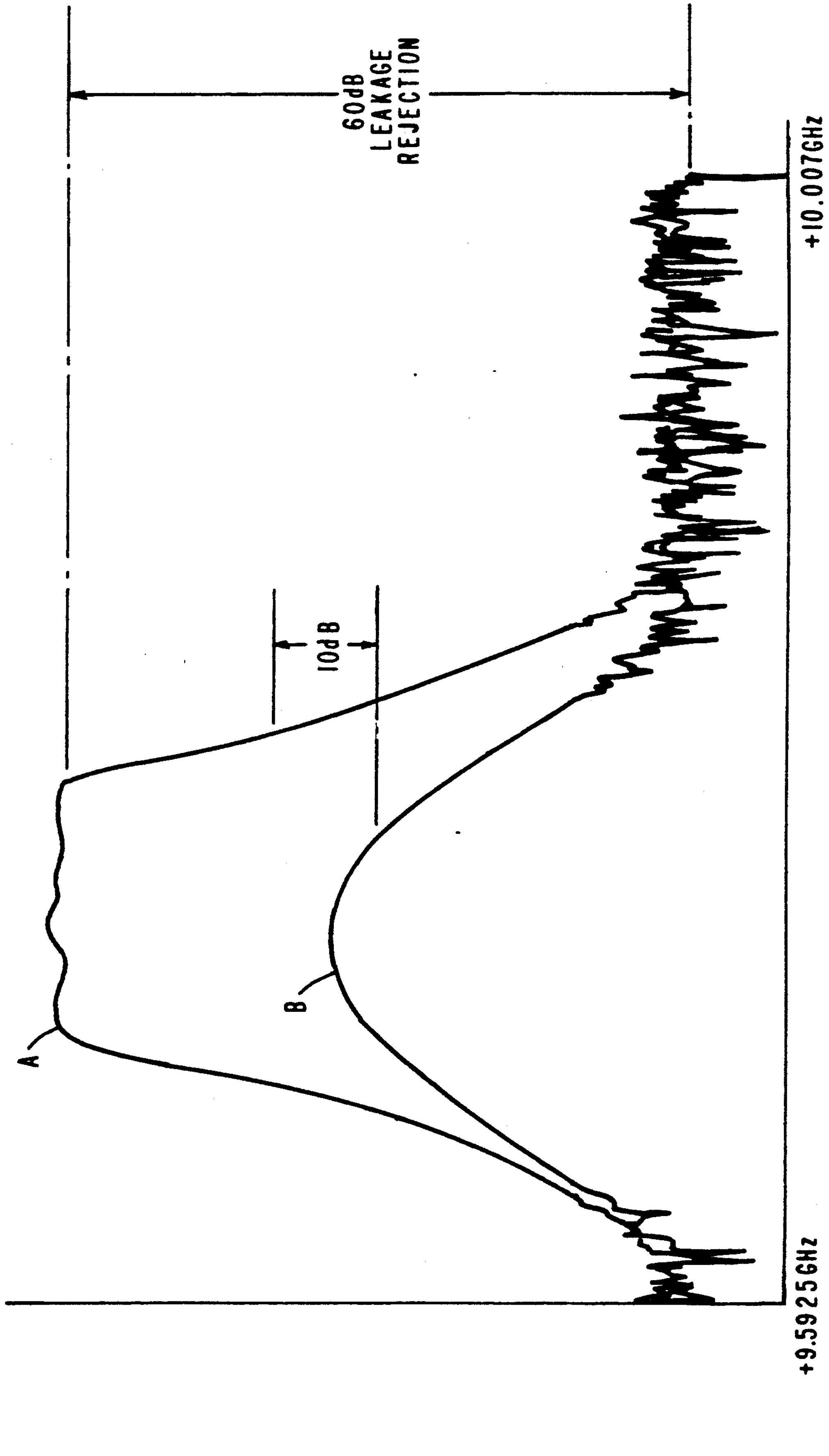
FIG. 4 is a graph showing the characteristics of a stripline filter in accordance with the present invention.

FIG. 4 is a graph showing the characteristics of a stripline filter in accordance with the present invention. The frequency response shown in FIG. 4 results from testing an Nb filter structure as shown in FIGS. 1A and 1B at a temperature of 4.2° K. (waveform A). In contrast waveform B results from testing a filter with the same structure using normal conductors as shown in FIGS. 1A and 1B at, for example, room temperature. The inband ripple in FIG. 4A can be minimized by minimizing any mismatch between the microstrip 45 shown in FIG. 3 and the connectors. This can be achieved by, for example, fabricating a microstrip 45 that has a width substantially equal to the width of a contact portion of the connector. FIG. 4 shows the superior performance of embodying the present invention in superconductor materials as compared to normal conductors. Waveform A has significantly less loss than waveform B, and has a shape much closer to an ideal shape than does waveform B.

In summary, superconducting stripline filters have high Qs and small size. This makes these stripline filters very desireable for application such as radar. However, stripline filters normally need microstrip launching regions in order to interface with other circuitry. Microstrip launching regions generally give rise to spurious waveguide modes due to their inherent asymmetrical structure. The present invention provides a structure which suppresses spurious waveguide modes by operating a microstrip launching regions well below $TE_{10}$ waveguide cutoff frequency and structuring the microstrip launching regions with a length sufficient to attenuate any leakage waveguide modes that are generated by the microstrip launching region.

The foregoing is considered as illustrative only of the principles of the invention which can easily be embodied in high temperature superconductors such as yttrium barium copper oxide, and dielectric substrates, such as lanthanum aluminate ($LaAlO_3$), sapphire, MgO, etc. operated at, e.g., 77° K. Further, since numerous modifications and changes will readily occur to those skilled in the art, it is not desired to limit the invention to the exact construction and application shown and descried, and accordingly, all suitable modifications and equivalents may be resorted to, falling within the scope of the invention and the appended claims and their equivalents.

We claim:

1. A superconducting stripline filter for filtering a received signal, said filter comprising:

a first dielectric substrate having a shape with an inner face, said first dielectric substrate having a first plane disposed on the inner face thereof and an axis in the first plane of the inner face, and including a central body region having opposing ends which are approximately perpendicular to the axis of said first dielectric substrate, and first and second microstrip launching regions disposed at the respective opposing ends of said central body region, each microstrip launching region oriented in the first plane on the inner face and laterally offset from the axis of said first dielectric substrate and having a width less than one half a wavelength of a waveguide mode associated with the received signal and having a length sufficient to attenuate the waveguide mode by a predetermined amount of loss;

a second dielectric substrate having a first face positioned to oppose the inner face of said first dielectric substrate and a shape corresponding to the shape of said central body region, said second dielectric substrate having a ground plane disposed on the first face thereof and absorbing stripes disposed along said ground plane;

superconducting resonator stripes disposed on said central body region of said first dielectric substrate on the inner face thereof, approximately parallel to the axis of said first dielectric substrate; and at least one microstrip disposed on each microstrip launching region of said first dielectric substrate on the inner face thereof.

2. A superconducting stripline filter for filtering a received signal according to claim 1, wherein said second dielectric substrate has a periphery, and wherein said absorbing stripes are formed adjacent the periphery of said second dielectric substrate.

3. A superconducting stripline filter for filtering a received signal according to claim 1, wherein said resonator stripes are substantially straight.

4. A superconducting stripline filter for filtering a received signal according to claim 1, wherein said absorbing stripes each extend into at least one of the microstrip launching regions.

5. A superconducting stripline filter for filtering a received signal according to claim 1, wherein said waveguide mode is a $TE_{10}$ mode.

6. A superconducting stripline filter for filtering a received signal according to claim 1, wherein said first and second dielectric substrates each comprise $LaAlO_3$.

7. A superconducting stripline filter for filtering a received signal according to claim 1, wherein said first and second dielectric substrates each comprise MgO.

8. A superconducting stripline filter for filtering a received signal according to claim 7, wherein said resonator stripes comprise a high temperature superconductor.

9. A superconducting stripline filter for filtering a received signal, comprising:

a first dielectric substrate formed of sapphire having a shape with an inner face, said first dielectric substrate having a crystallographic C axis, said first dielectric substrate including a central body region having opposing ends which are approximately perpendicular to the axis of said first dielectric substrate, and first and second microstrip launching regions disposed at the respective opposing ends of said central body region, each microstrip launching region laterally offset from the crystallographic C axis of said first dielectric substrate and having a width less than one half a wavelength of a waveguide mode associated with the received signal and having a length sufficient to attenuate the waveguide mode by a predetermined amount of loss;

a second dielectric substrate having a first face positioned to oppose the inner face of said first dielectric substrate and a shape corresponding to the shape of said central body region, said second dielectric substrate having a ground plane disposed on the first face thereof and absorbing stripes disposed along said ground plane;

superconducting resonator stripes disposed on said central body region of said first dielectric substrate on the inner face thereof, approximately parallel to the C axis of said first dielectric substrate; and at least one microstrip disposed on each microstrip launching region of said first dielectric substrate on the inner face thereof.

10. A superconducting stripline filter for filtering a received signal according to claim 9, wherein the predetermined amount of loss equals 27.25 decibels times the length divided by the width.

* * * * *